(12) United States Patent
Cho et al.

(10) Patent No.: US 10,649,411 B2
(45) Date of Patent: May 12, 2020

(54) DISPLAY DEVICE AND SMART WATCH

(71) Applicant: Samsung Display Co., Ltd., Yongin-Si, Gyeonggi-Do (KR)

(72) Inventors: Jaehyung Cho, Suwon-si (KR); Hae-kwan Seo, Gyeonggi-do (KR); Seongheon Cho, Yongin-si (KR); Myungho Lee, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 451 days.

(21) Appl. No.: 15/073,474

(22) Filed: Mar. 17, 2016

(65) Prior Publication Data

US 2017/0082982 A1    Mar. 23, 2017

(30) Foreign Application Priority Data

Sep. 21, 2015   (KR) .......................... 10-2015-0133411

(51) Int. Cl.
```
G04G 9/00       (2006.01)
G06F 1/16       (2006.01)
H05K 1/14       (2006.01)
```

(52) U.S. Cl.
CPC ........... *G04G 9/0064* (2013.01); *G06F 1/163* (2013.01); *H05K 1/147* (2013.01); *H05K 2201/10128* (2013.01)

(58) Field of Classification Search
CPC ...... G04G 9/0064; G06F 1/163; H05K 1/147; H05K 2201/10128
See application file for complete search history.

(56) References Cited

U.S. PATENT DOCUMENTS

| | | | |
|---|---|---|---|
| 6,216,490 B1 * | 4/2001 | Radley-Smith | A44C 5/0015 345/56 |
| 8,063,400 B2 | 11/2011 | Sugimoto | |
| 9,218,114 B1 * | 12/2015 | Gray | G06F 3/0481 |
| 9,507,324 B2 | 11/2016 | Guo et al. | |
| 9,837,038 B2 | 12/2017 | Lee | |
| 10,054,988 B2 | 8/2018 | Jin et al. | |
| 10,055,039 B2 | 8/2018 | Myers et al. | |
| 10,178,208 B2 | 1/2019 | Kim | |
| 10,248,210 B2 | 4/2019 | Modarres et al. | |

(Continued)

FOREIGN PATENT DOCUMENTS

| | | |
|---|---|---|
| CN | 201904821 U | 7/2011 |
| CN | 102855821 A | 1/2013 |

(Continued)

*Primary Examiner* — Nitin Patel
*Assistant Examiner* — Amy Onyekaba
(74) *Attorney, Agent, or Firm* — Lewis Roca Rothgerber Christie LLP

(57) ABSTRACT

A display device and a smart watch are disclosed. In one aspect, the display device includes a front display panel configured to display a front image in a front direction and having an edge at the perimeter that is curved. The display device also includes a side display panel that is curved and configured to display a side image in a side direction conforming to the edge of the front display panel. The display device further includes a driver circuit board connected to the front and side display panels and configured to respectively apply first and second signals, corresponding to image data, to the front and side display panels.

25 Claims, 9 Drawing Sheets

(56) References Cited

U.S. PATENT DOCUMENTS

| | | | | |
|---|---|---|---|---|
| 2005/0174302 | A1* | 8/2005 | Ishii | G06F 3/1423 345/30 |
| 2006/0034161 | A1* | 2/2006 | Muller | G04B 37/0427 368/281 |
| 2007/0033847 | A1* | 2/2007 | Tanaka | G06F 1/163 40/661.05 |
| 2012/0218220 | A1* | 8/2012 | Tsai | H03K 17/9622 345/174 |
| 2013/0082901 | A1* | 4/2013 | Watanabe | G02F 1/13336 345/1.3 |
| 2013/0110264 | A1* | 5/2013 | Weast | G06F 19/3481 700/91 |
| 2014/0118221 | A1* | 5/2014 | Park | G09G 3/20 345/1.3 |
| 2015/0223355 | A1 | 8/2015 | Fleck et al. | |
| 2015/0338879 | A1* | 11/2015 | Hiramoto | G06F 1/163 361/679.03 |
| 2016/0027380 | A1* | 1/2016 | Kim | G09G 3/3258 315/172 |
| 2016/0109852 | A1* | 4/2016 | Kuwabara | G04B 19/00 368/223 |
| 2016/0157372 | A1* | 6/2016 | Hiroki | G06F 1/163 361/748 |
| 2016/0291745 | A1* | 10/2016 | Grip | G04G 21/08 |
| 2016/0379906 | A1* | 12/2016 | Kim | G09G 3/3688 257/48 |

FOREIGN PATENT DOCUMENTS

| | | |
|---|---|---|
| CN | 102882997 A | 1/2013 |
| CN | 103828334 A | 5/2014 |
| CN | 104122996 A | 10/2014 |
| CN | 104160632 A | 11/2014 |
| CN | 104238349 A | 12/2014 |
| CN | 104732908 A | 6/2015 |
| KR | 10-2014-0137814 A | 12/2014 |
| KR | 10-2015-0025507 A | 3/2015 |
| KR | 10-2016-0096789 | 8/2016 |
| WO | WO 2008/123416 A1 | 10/2008 |

* cited by examiner

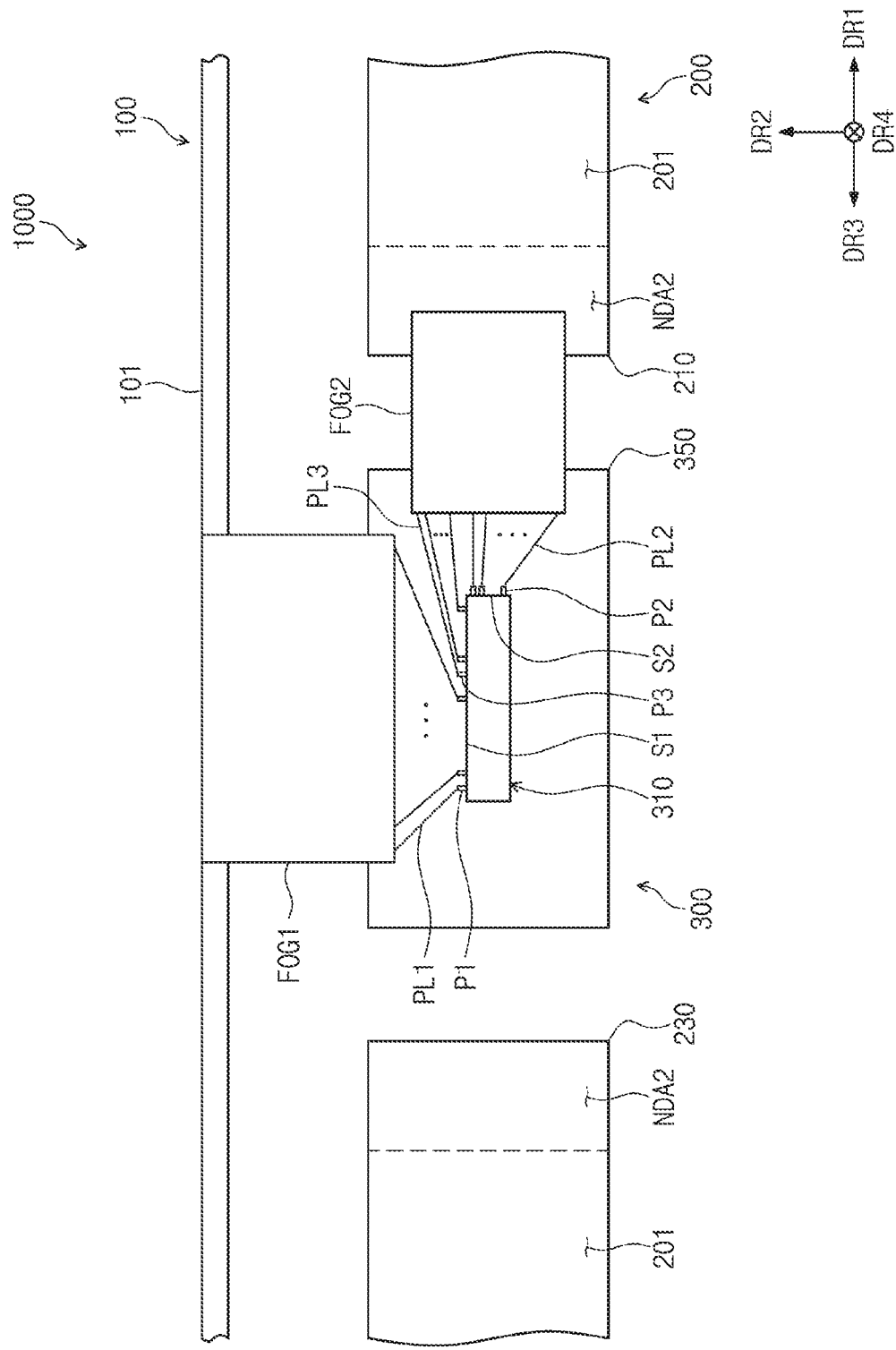

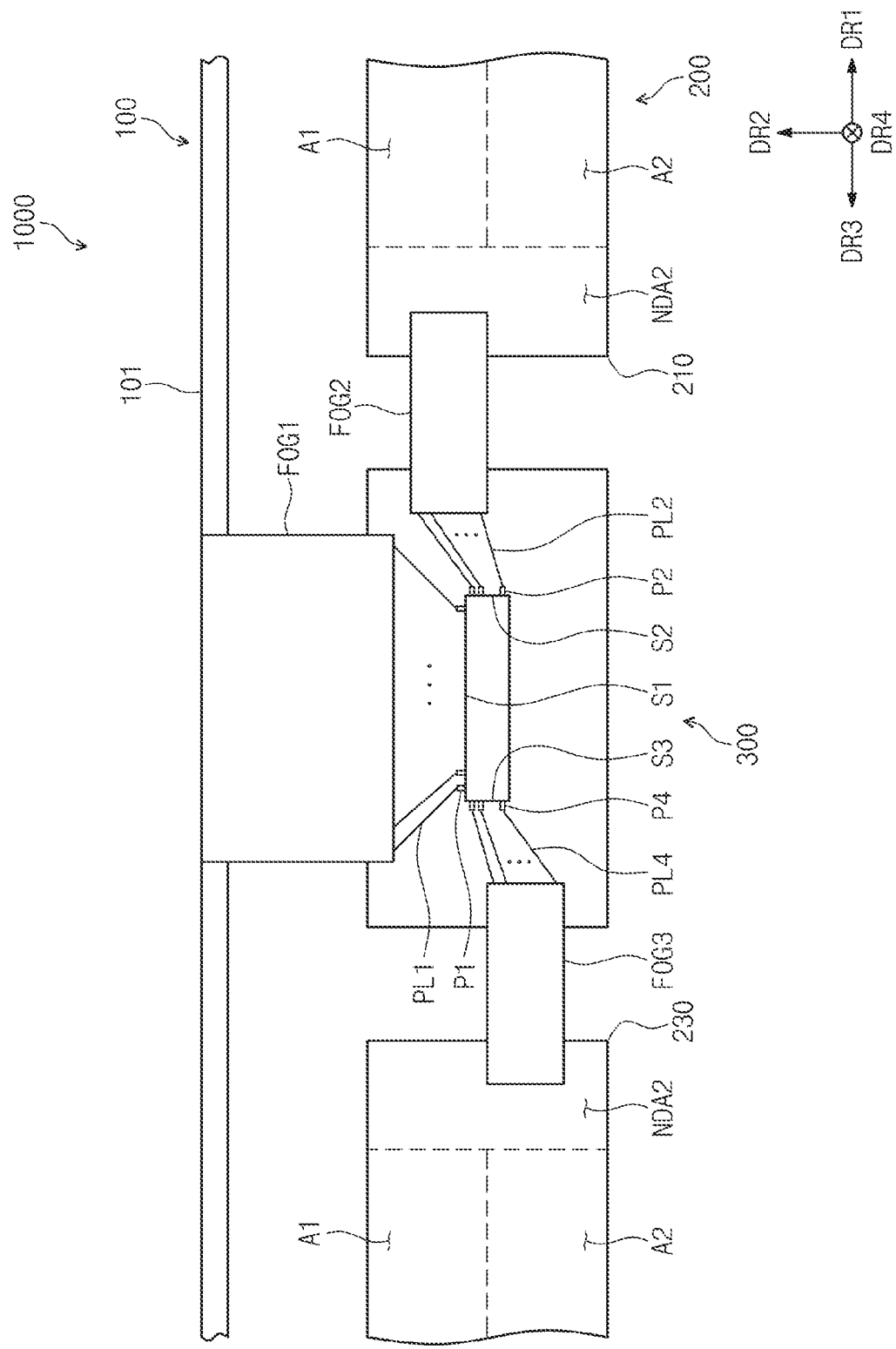

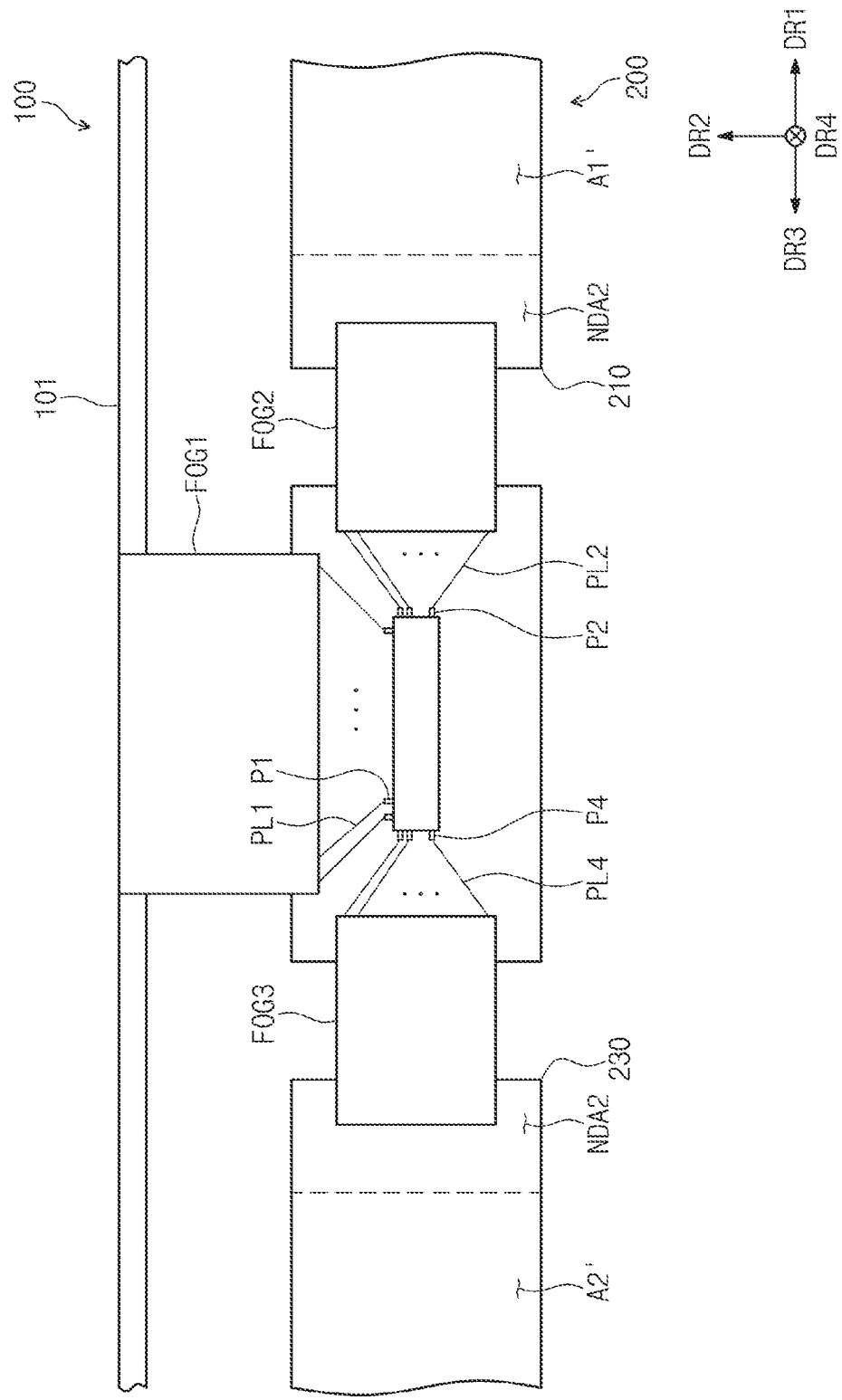

DISPLAY DEVICE AND SMART WATCH

CROSS-REFERENCE TO RELATED APPLICATION

This U.S. non-provisional patent application claims priority under 35 U.S.C. § 119 of Korean Patent Application No. 10-2015-0133411, filed on Sep. 21, 2015, the contents of which are hereby incorporated by reference in its entirety.

BACKGROUND

Field

The described technology generally relates to a display device and a smart watch.

Description of the Related Technology

Various multimedia devices, such as a television set, a mobile phone, a navigation system, a computer monitor, a game machine, etc., include display devices. In recent years, a curved or folded display device (hereinafter, referred to as a flexible display device) has been developed in accordance with increasing market demand. The flexible display device includes a flexible display panel and various functional members including diving circuitry to transfer image data to the display pixels.

SUMMARY OF CERTAIN INVENTIVE ASPECTS

One inventive aspect relates to a flexible display device.

Another aspect is a display device including a front display panel displaying a front image to a front direction and having a round edge when viewed from the front direction, a side display panel displaying a side image to a side direction different from the front direction and curved to face the edge when viewed from the front direction, and a driving board connected to the front display panel and the side display panel and applying first and second signals to the front display panel and the side display panel, respectively.

The front display panel includes a front display surface substantially vertical to the front direction and the side display panel includes a side display surface substantially vertical to the side direction.

The side display surface is curved along the edge.

The driving board includes a driving chip generating the first and second signals.

The display device further includes a first conductive film connecting the driving chip and the front display panel and a second conductive film connecting the driving chip and an one end of the side display panel.

The driving chip includes a plurality of first pins connected to the first conductive film and a plurality of second pins connected to the second conductive film.

The driving chip includes a first side substantially parallel to a first direction and a second side substantially parallel to a second direction, the first pins are disposed at the first side, and the second pins are disposed at the second side.

The driving board includes a plurality of first fan-out lines and a plurality of second fan-out lines, one ends of the first fan-out lines are respectively connected to the first pins, the other ends of the first fan-out lines are connected to the first conductive film, one ends of the second fan-out lines are respectively connected to the second pins, and the other ends of the second fan-out lines are connected to the second conductive film.

The driving board includes a plurality of third fan-out lines, the driving chip includes a plurality of third pins disposed at the first side, one ends of the third fan-out lines are respectively connected to the third pins, and the other ends of the third fan-out lines are connected to the second conductive film.

The first fan-out lines are arranged in the first direction and the second fan-out lines are arranged in the second direction.

When viewed from the front direction, the side display panel surrounds the front display panel, the one end of the side display panel is disposed adjacent to one end of the driving board in the first direction, and the other end of the side display panel is disposed adjacent to the other end of the driving board in a third direction opposite to the first direction.

The display device further includes a third conductive film to connect the driving chip and the other end of the side display panel.

The driving chip includes a plurality of fourth pins connected to the third conductive film.

The driving chip includes a third side substantially parallel to the second direction and disposed adjacent to the second side in the third direction, and the fourth pins are disposed at the third side.

The second signal includes a first side signal applied to a first area of the side display panel and a second side signal applied to a second area of the side display panel, the second pins output the first side signal, and the fourth pins output the second side signal.

The first area is defined adjacent to the second area in the second direction.

The second area is defined adjacent to the first area in the third direction.

The first signal includes a first data voltage used to display the front image and the second signal includes a second data voltage used to display the side image.

The first signal includes a first gate signal to turn on transistors of pixel circuits included in the front display panel and the second signal includes a second gate signal to turn on transistors of pixel circuits included in the side display panel.

The display device further includes a body portion including an upper surface substantially vertical to the front direction and a side surface substantially vertical to the side direction. The front display panel is coupled to the upper surface of the body portion and the side display panel is coupled to the side surface of the body portion.

The front display panel has substantially a circular plate shape and the side display panel is curved to surround a circumference of the display panel.

The front direction is substantially vertical to the side direction.

Another aspect is a display device comprising: a front display panel configured to display a front image in a front direction and having an edge at the perimeter that is curved; a side display panel that is curved and configured to display a side image in a side direction conforming to the edge of the front display panel; and a driver circuit board connected to the front and side display panels and configured to respectively apply first and second signals, corresponding to image data, to the front and side display panels.

In the above display device, the front display panel comprises a front display surface crossing the front direction, wherein the side display panel comprises a side display surface crossing the side direction.

In the above display device, the side display surface is curved along the edge.

In the above display device, the driver circuit board comprises a driving chip configured to generate the first and second signals.

The above display device further comprises: a first conductive film configured to electrically connect the driving chip and the front display panel; and a second conductive film configured to electrically connect the driving chip and a first end of the side display panel.

In the above display device, the driving chip comprises: a plurality of first pins electrically connected to the first conductive film; and a plurality of second pins electrically connected to the second conductive film.

In the above display device, the driving chip comprises a first side substantially parallel to a first direction and a second side substantially parallel to a second direction crossing the first direction, wherein the first pins are disposed on the first side, and wherein the second pins are disposed on the second side.

In the above display device, the driver circuit board comprises a plurality of first fan-out lines each having first and second ends opposing each other and a plurality of second fan-out lines each having first and second ends opposing each other, wherein the first ends of the first fan-out lines are respectively connected to the first pins, wherein the second ends of the first fan-out lines are connected to the first conductive film, wherein the first ends of the second fan-out lines are respectively connected to the second pins, and wherein the second ends of the second fan-out lines are connected to the second conductive film.

In the above display device, the driver circuit board comprises a plurality of third fan-out lines each having first and second ends opposing each other, wherein the driving chip comprises a plurality of third pins disposed on the first side, wherein the first ends of the third fan-out lines are respectively connected to the third pins, and wherein the second ends of the third fan-out lines are connected to the second conductive film.

In the above display device, the first fan-out lines are arranged in the first direction, wherein the second fan-out lines are arranged in the second direction.

In the above display device, the side display panel surrounds the front display panel, wherein the first end of the side display panel is disposed adjacent to a first end of the driver circuit board in the first direction, and wherein a second end of the side display panel is disposed adjacent to a second end of the driver circuit board in a third direction opposite to the first direction.

The above display device further comprises a third conductive film configured to connect the driving chip and the second end of the side display panel.

In the above display device, the driving chip comprises a plurality of fourth pins connected to the third conductive film.

In the above display device, the driving chip comprises a third side substantially parallel to the second direction and disposed adjacent to the second side in the third direction, wherein the fourth pins are disposed on the third side.

In the above display device, the third conductive film is located farther from the front display panel than the second conductive film.

In the above display device, the second signal comprises a first side signal to be applied to a first area of the side display panel and a second side signal to be applied to a second area of the side display panel different from the first area, wherein the second pins are configured to output the first side signal, and wherein the fourth pins are configured to output the second side signal.

In the above display device, the first area is located adjacent to the second area in the second direction.

In the above display device, the second area is located adjacent to the first area in the third direction.

In the above display device, the first signal comprises a first data voltage, wherein the second signal comprises a second data voltage.

In the above display device, the front display panel includes a plurality of front pixel circuits including a plurality of transistors, wherein the side display panel includes a plurality of side pixel circuits including a plurality of transistors, wherein the transistors of the front pixel circuits are configured to be turned on based on the first signal, and wherein the transistors of the side pixel circuits are configured to be turned on based on the second signal.

The above display device further comprises a body portion comprising an upper surface crossing the front direction and a side surface crossing the side direction, wherein the front display panel is coupled to the upper surface of the body portion, and wherein the side display panel is coupled to the side surface of the body portion.

In the above display device, the front display panel has substantially a circular plate shape, wherein the side display panel is curved and surrounds a circumference of the display panel.

In the above display device, the front direction is crosses the side second direction.

Another aspect is a smart watch comprising: a body portion having an upper surface and a side surface adjacent to the upper surface; a front display panel disposed over the upper surface of the body portion and comprising a round edge; a side display panel disposed over the side surface of the body portion and curved to surround the edge; a driver circuit board disposed over the side surface of the body portion, wherein the driver circuit board comprises a first pad area adjacent to the front display panel and a second pad area facing an end of the side display panel; a first conductive film configured to connect the first pad area and the front display panel; and a second conductive film configured to connect the second pad area and an end of the side display panel.

In the above smart watch, the body portion includes a slanted surface connecting the front and side display panels.

According to at least one of the disclosed embodiments, the display device includes the front display panel and the side display panel curved corresponding to the round edge of the front display panel. Therefore, usability and convenience of the display device can be improved. In addition, the display device includes the driving board to apply the driving signal to each of the front display panel and the side display panel. Thus, the number of the lines required to apply the driving signal can be reduced, so that the non-display area of the front display panel and the side display panel can be reduced.

BRIEF DESCRIPTION OF THE DRAWINGS

FIG. 4 is an enlarged side view showing a driver circuit board and a portion of elements connected to the driver circuit board according to another exemplary embodiment of the present disclosure.

FIG. 5C is an enlarged plan view showing the side display panel shown in FIG. 5B and a portion of a driver circuit board connected to the side display panel.

FIG. 6C is an enlarged plan view showing the side display panel shown in FIG. 6B and a portion of a driver circuit board connected to the side display panel.

DETAILED DESCRIPTION OF CERTAIN INVENTIVE EMBODIMENTS

Figure 1A:
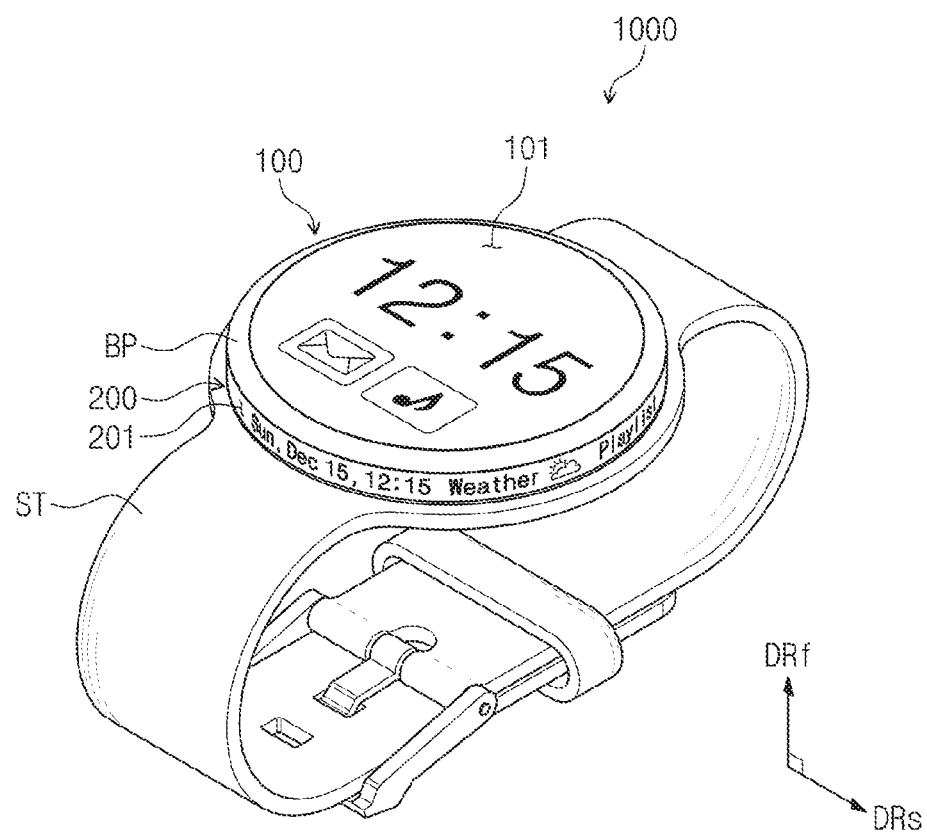
FIG. 1A is a perspective view showing a display device according to an exemplary embodiment of the present disclosure.

It will be understood that when an element or layer is referred to as being "on", "connected to" or "coupled to" another element or layer, it can be directly on, connected or coupled to the other element or layer or intervening elements or layers can be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. can be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the described technology.

Spatially relative terms, such as "beneath", "below", "lower", "above", "upper" and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device can be otherwise oriented (rotated 90 degrees or at other orientations) and the spatially relative descriptors used herein interpreted accordingly.

The terminology used herein is for the purpose of describing particular embodiments only and is not intended to be limiting of the described technology. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this described technology belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the described technology will be explained in detail with reference to the accompanying drawings. In this disclosure, the term "substantially" includes the meanings of completely, almost completely or to any significant degree under some applications and in accordance with those skilled in the art. Moreover, "formed, disposed or positioned over" can also mean "formed, disposed or positioned on." The term "connected" includes an electrical connection.

Figure 1B:
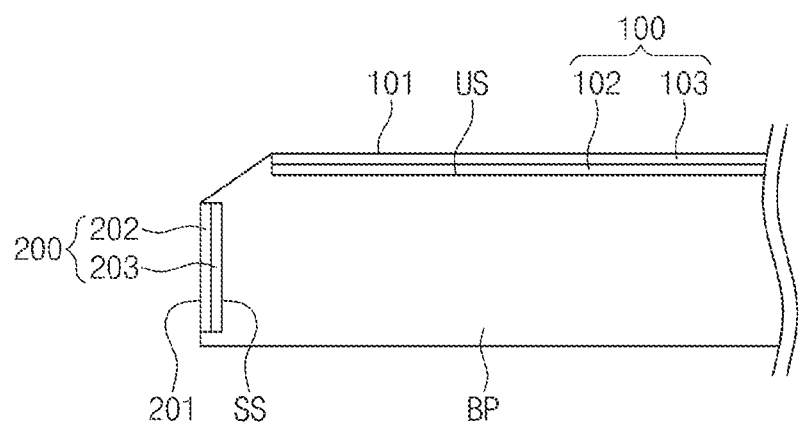
FIG. 1B is a cross-sectional view showing a portion of the display device shown in FIG. 1A.

FIG. 1A is a perspective view showing a display device 1000 according to an exemplary embodiment of the present disclosure and FIG. 1B is a cross-sectional view showing a portion of the display device 1000 shown in FIG. 1A.

Referring to FIG. 1A, the display device 1000 can be, but not limited to, a smart watch. According to another embodiment, the display device 1000 can be an electronic equipment to display an image, e.g., a mobile phone, a tablet, a monitor, a television set, etc.

The display device 1000 includes a front display panel 100 and a side display panel 200.

For example, the front display panel 100 displays the image (hereinafter, referred to as a front image) in a front direction DRf. The front display panel 100 includes a front display surface 101 substantially perpendicular to or crossing the front direction DRf. The front display panel 100 displays the front image through the front display surface 101.

At least a portion of an edge (or an end portion) of the front display panel 100 is rounded. For example, at least a portion of the edge of the front display panel 100 is rounded when viewed from the front direction DRf. The term "rounded" used herein means that the portion is curved, bent, or has a curved line shape when viewed from the front direction DRf.

In the present exemplary embodiment, the front display panel 100 has substantially a circular plate shape. Accordingly, the edge of the front display panel 100 has substantially a circular shape. According to another exemplary embodiment, the edge can have an oval shape or a polygonal shape with a rounded corner.

As shown in FIG. 1A, the front image mainly displays main information, such as the current time. In addition, the front image displays an icon or an execution screen of applications executed in an application processor (not shown) of the display device 1000. As shown in FIG. 1A, the front image displays a mail application icon and a music reproduction application at a lower portion of the current time.

The side display panel 200 displays an image (hereinafter, referred to as a side image) in a side direction DRs. In the present exemplary embodiment, the side direction DRs is substantially vertical to the front direction DRf. According to another exemplary embodiment, the side direction DRs can form an acute angle with the front direction DRf.

The side display panel 200 includes a side display surface 201 substantially perpendicular to or crossing the side direction DRs. The side display panel 200 displays the side image through the side display surface 201.

The side display panel 200 has a curved shape to correspond to the edge when viewed from the front direction DRf. In the present exemplary embodiment, the side display panel 200 is provided to surround the edge having the circular shape and has substantially a ring shape to surround the edge when viewed from the front direction DRf. Therefore, the side display surface 201 always faces an outer side, i.e. the side direction DRs, and a rear surface BS of the side display panel 200, which is opposite to the side display surface 201, faces the edge.

The side image mainly displays simple information, such as a current date, a current weather, a current playing song, etc. In the present exemplary embodiment, the side display surface 201 has an area smaller than that of the front display surface 101.

The display device 1000 can further include a watch strap ST. The front display panel 100 and the side display panel 200 are coupled to the watch strap ST.

Referring to FIG. 1B, the display device 1000 includes a body portion BP. The body portion BP includes an upper surface US and a side surface SS. The upper surface US is substantially perpendicular to or crossing the front direction DRf and the side surface SS is substantially perpendicular to or crossing the side direction DRs.

The front display panel 100 is coupled to the upper surface US. As an example, a portion of the upper surface US coupled to the front display panel 100 is recessed toward a center of the body portion BP. In addition, the side display panel 200 is coupled to the side surface SS. As an example, a portion of the side surface SS coupled to the side display panel 200 is recessed toward a center of the body portion BP.

In the present exemplary embodiment, the front display panel 100 and the side display panel 200 can be an organic light emitting diode (OLED) display panel. According to another exemplary embodiment, the front display panel 100 and the side display panel 200 can be a flat display panel, e.g., a liquid crystal display (LCD) panel. In the front display panel 100 and the side display panel 200 are the LCD panel, the display device 100 can further include a backlight unit to provide a light to the front display panel 100 and the side display panel 200.

Although not shown in figures, the front display panel 100 and the side display panel 200 include a plurality of pixels, a plurality of gate lines connected to the pixels, and a plurality of data lines connected to the pixels. In the present exemplary embodiment, the pixels can include an organic light emitting layer. According to another exemplary embodiment, the pixels can include a liquid crystal layer.

The front display panel 100 includes a front lower substrate 102 and a front upper substrate 103. The front lower substrate 102 includes a pixel electrode and a pixel circuit driving the pixel electrode of each pixel. The front upper substrate 103 faces the front lower substrate 102. Each of the front lower substrate 102 and the front upper substrate 103 is a glass substrate formed of glass or a flexible substrate formed of polymer.

In addition, the side display panel 200 includes a side lower substrate 202 and a side upper substrate 203. The side lower substrate 202 and the side upper substrate 203 have substantially the same structure and function as those of the front lower substrate 102 and the front upper substrate 103, and thus details thereof will be omitted.

Figure 2A:
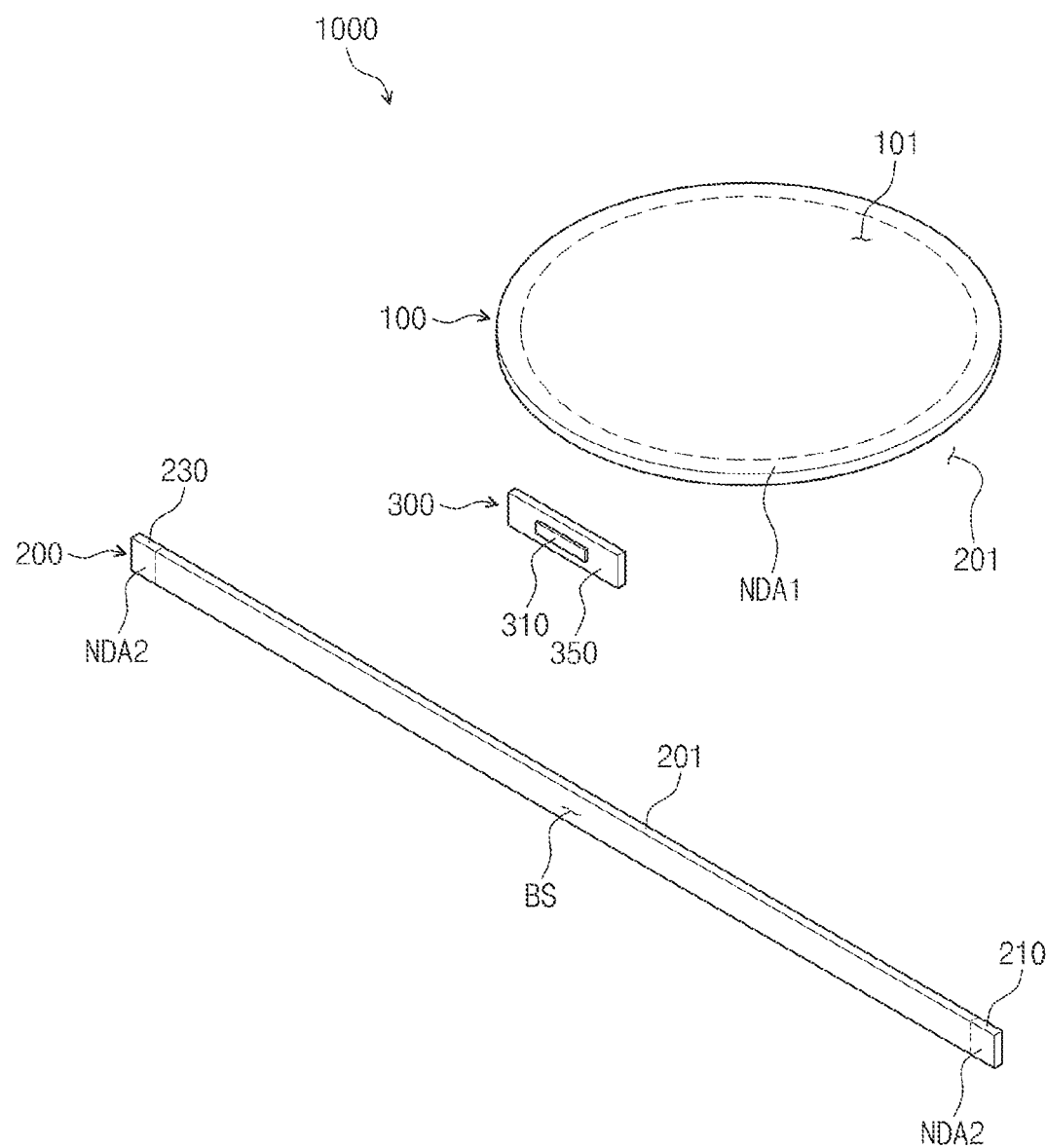
FIG. 2A is a side view showing a portion of elements included in the display device before the display device is assembled.
Figure 2B:
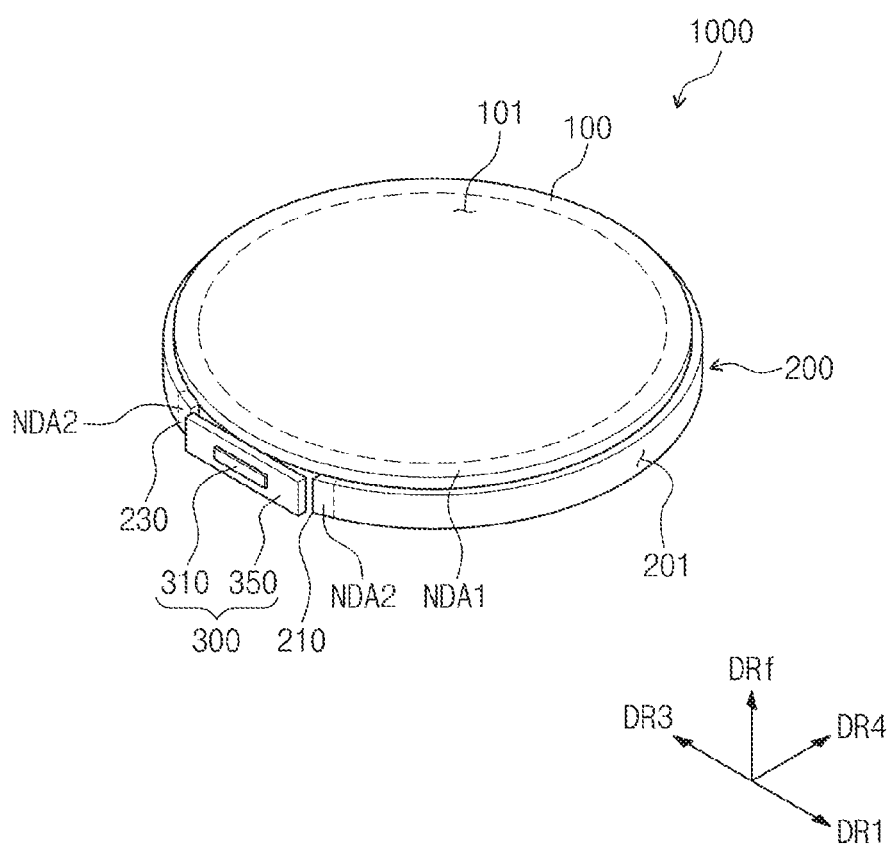
FIG. 2B is a perspective view showing the display device shown in FIG. 2A after the elements are assembled.

FIG. 2A is a side view showing a portion of elements included in the display device 1000 before the display device is assembled. FIG. 2B is a perspective view showing the display device 1000 shown in FIG. 2A after the elements are assembled with each other.

For the convenience of explanation, the body portion BP (refer to FIG. 1B) has been omitted in FIG. 2A. Referring to FIG. 2A, the display device 1000 further includes a driver circuit board 300. The driver circuit board 300 drives the front display panel 100 and the side display panel 200. For example, the driver circuit board 300 generates first and second signals and respectively applies the first and second signals to the front display panel 100 and the side display panel 200 to drive the front display panel 100 and the side display panel 200.

The driver circuit board 300 includes a driving chip 310 and a printed circuit board 350. The driving chip 310 is mounted on the printed circuit board 350.

In the present exemplary embodiment, the driving chip 310 includes a controller, a data driver, and a gate driver. The controller, the data driver, and the gate driver can be realized in an IC on the driving chip 310.

In the present exemplary embodiment, the controller receives a control signal and an image signal from an external set, e.g., a graphic card, and generates a gate control signal, a data control signal, and image data on the basis of the control signal and the image signal. The image data include information corresponding to the image displayed by the pixels.

The gate driver is controlled by the gate control signal. The gate driver generates a gate signal. The gate signal includes signals to turn on or off a switching transistor of the pixel circuit.

The data driver is controlled by the data control signal. The data driver receives the image data and converts the image data to data voltages. The data driver applies the data voltages to the pixels that are turned on.

According to another exemplary embodiment, at least one of the data driver or the gate driver is not included in the driving chip 310 and is mounted on the front display panel 100 and the side display panel 200.

The driving chip 310 generates the first and second signals. The first and second signals respectively correspond to the front image and the side image. In the present exemplary embodiment, the first signal includes a first gate signal applied to the gate line of the front display panel 100 and a first data voltage applied to the data line of the front display panel 100. In addition, the second signal includes a second gate signal applied to the gate line of the side display panel 200 and a second data voltage applied to the data line of the side display panel 200.

However, according to another exemplary embodiment, in the case where the gate driver is included in the front display panel 100, the first signal can include the gate control signal and the first data voltage.

The front display panel 100 includes a first non-display area NDA1. As an example, the front display surface 101 has substantially a circular shape and the first non-display area NDA1 surrounds the front display surface 101. The pixels can be provided to the front display surface 101 and not provided to the first non-display area NDA1, and lines or driving circuits used to drive the pixels of the front display surface 101 can be disposed in the first non-display area NDA1.

The side display panel 200 includes a second non-display area NDA2. In the present exemplary embodiment, the second non-display area NDA2 can be provided corresponding to one end 210 of the side display panel 200 and the other end 230 of the side display panel 200. According to another exemplary embodiment, the second non-display area NDA2 can be provided corresponding to only the one end 210 of the side display panel 200 and the side display surface 201 can be provided to the other end 230 of the side display panel 200.

As an example, the side display surface 201 has substantially a rectangular shape having long sides substantially parallel to the first direction DR1 and short sides substantially parallel to the front direction DRf. The side display surface 201 is interposed between the second non-display areas NDA2.

The pixels can be provided to the side display surface 201 and not provided to the second non-display area NDA2, and lines or driving circuits used to the pixels of the side display surface 201 can be disposed in the second non-display area NDA2.

FIG. 2B is a perspective view showing the display device 1000 shown in FIG. 2A after the elements are assembled with each other.

Referring to FIG. 2B, the side display panel 200 is curved in a ring shape to correspond to the edge of the front display panel 100 and disposed to surround the edge of the front display panel 100 when viewed from the front direction DRf.

The driver circuit board 300 and the side display panel 200 are disposed on the side surface SS of the body portion BP (refer to FIG. 1B), but they should not be limited thereto or thereby. At least a portion or all of the driver circuit board 300 can be disposed on a lower surface of the body portion BP.

As an example, both ends of the side display panel 200 can be disposed adjacent to both ends of the driver circuit board 300. For example, the one end 210 of the side display panel 200 is disposed adjacent to one end of the printed circuit board 350 in the first direction DR1 and the other end 230 of the side display panel 200 is disposed adjacent to the other end of the printed circuit board 350 in the third direction DR3 opposite to the first direction DR1.

The first and third directions DR1 and DR3 are substantially perpendicular to or crossing the front direction DRf. That is, the first and third directions DR1 and DR3 are included in the side direction DRs.

Figure 3:
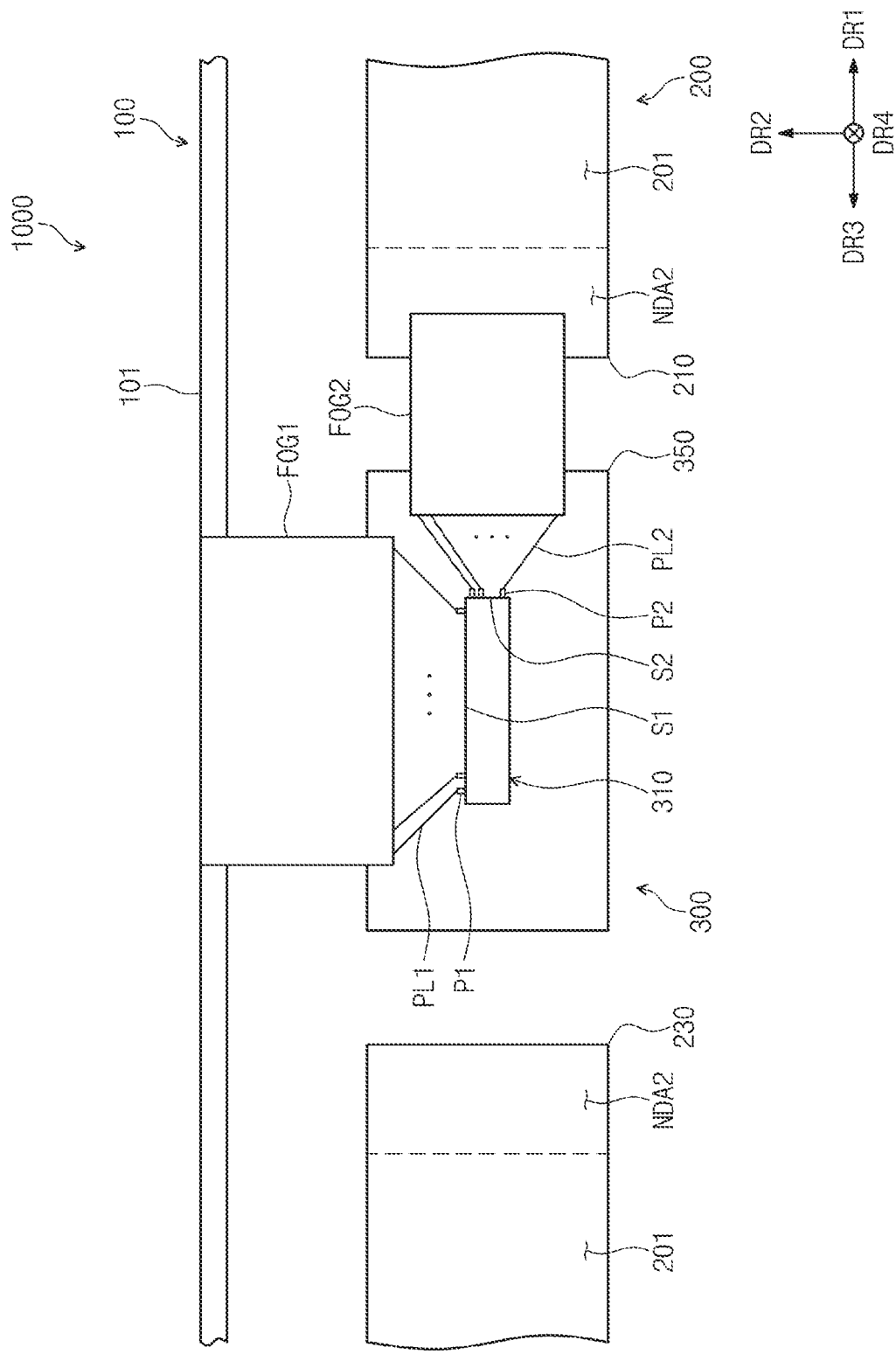
FIG. 3 is an enlarged side view showing a driver circuit board and a portion of elements connected to the driver circuit board shown in FIG. 2B.

FIG. 3 is an enlarged side view showing a driver circuit board and a portion of elements connected to the driver circuit board shown in FIG. 2B. FIG. 3 shows a side surface view of the display device shown in FIG. 2B when viewed in a fourth direction DR4. The fourth direction DR4 is included in the side direction DRs.

Referring to FIG. 3, the display device 1000 further includes a first conductive film FOG1 and a second conductive film FOG2.

One end and the other end of the first conductive film FOG1 overlap the printed circuit board 350 and the front display panel 100, respectively, and are electrically connected to the printed circuit board 350 and the front display panel 100, respectively. The first conductive film FOG1 receives the first signal from the driving chip 310 and applies the first signal to the front display panel 100. In the present exemplary embodiment, the first conductive film FOG1 is connected to a first pad area (not shown) of the printed circuit board 350. The first pad area is disposed adjacent to the front display panel 100.

One end and the other end of the second conductive film FOG2 overlap the printed circuit board 350 and the side display panel 200, respectively, and are electrically connected to the printed circuit board 350 and the side display panel 200, respectively. The second conductive film FOG2 receives the second signal from the driving chip 310 and applies the second signal to the side display panel 200. In the present exemplary embodiment, the second conductive film FOG2 is connected to a second pad area (not shown) of the printed circuit board 350. The second pad area faces the one end 210 of the side display panel 200.

The first and second conductive films FOG1 and FOG2 include a flexible printed circuit board and are electrically connected to the printed circuit board 250, the front display panel 100, and the side display panel 200 through an anisotropy conductive film (ACF) in a film-on-glass (FOG) form.

The driving chip 310 includes a plurality of first pins P1 and a plurality of second pins P2. The first pins P1 are disposed at a first side S1 of the driving chip 310 and the second pins P2 are disposed at a second side S2 of the driving chip 310. The first pins P1 are arranged in the first direction DR1 at regular intervals and the second pins P2 are arranged in the second direction DR2 at regular intervals.

The first side S1 is substantially parallel to the first direction DR1 and faces the first conductive film FOG1. The second side S2 is substantially parallel to the second direction DR2 and faces the second conductive film FOG2. In the present exemplary embodiment, the second direction DR2 can be substantially parallel to the front direction DRf (refer to FIG. 1A).

In the present exemplary embodiment, the driver circuit board 300 includes a plurality of first fan-out lines PL1 and a plurality of second fan-out lines PL2.

The first fan-out lines PL1 are interposed between the first conductive film FOG1 and the first pins P1 and one ends and the other ends of the first fan-out lines PL1 are electrically connected to the first pins P1 and the first conductive film FOG1, respectively. The first fan-out lines PL1 are arranged in the first direction DR1 at regular intervals.

The first fan-out lines PL1 extend in a fan-out structure. For example, the distance in the first direction DR1 between the one ends of the first fan-out lines PL1 is smaller than the distance in the first direction DR1 between the other ends of the first fan-out lines PL1.

The first fan-out lines PL1 receive the first signal from the first pins P1 and apply the first signal to the first conductive film FOG1.

The second fan-out lines PL2 are interposed between the second conductive film FOG2 and the second pins P2 and one ends and the other ends of the second fan-out lines PL2 are electrically connected to the second pins P2 and the second conductive film FOG2, respectively. The second fan-out lines PL2 are arranged in the second direction DR2 at regular intervals.

The second fan-out lines PL2 extend in a fan-out structure. For example, the distance in the second direction DR2 between the one ends of the second fan-out lines PL2 is smaller than the distance in the second direction DR2 between the other ends of the second fan-out lines PL2.

The second fan-out lines PL2 receive the second signal from the second pins P2 and apply the second signal to the second conductive film FOG2.

Consequently, the front display panel 100 receives the first signal output from the first pins P1 through the first fan-out lines PL1 and the first conductive film FOG1. Accordingly, the front display panel 100 displays the front image through the front display surface 101.

Similarly, the side display panel 200 receives the second signal output from the second pins P2 through the second fan-out lines PL2 and the second conductive film FOG2. Thus, the side display panel 200 displays the side image through the side display surface 201.

As described above, the front display panel 100 has the round edge when viewed in the front direction DRf, the side display panel 200 has the curved shape corresponding to the edge, and the front display panel 100 and the side display panel 200 display the images to the front direction DRf and the side direction DRs, respectively. Therefore, usability and convenience of the smart watch can be improved.

In addition, since the display device 1000 includes the driving chip 310 directly applying the first and second signals to the front display panel 100 and the side display panel 200, respectively, the number of the lines used to apply the first and second signals can be reduced and the area of the non-display areas NDA1 and NDA2 (refer to FIG. 2B) of the front display panel 100 and the side display panel 200, which is required for the lines, can be reduced.

For instance, in the case where the side display panel 200 indirectly receives the second signal output from the driving chip 310 through an intermediate line provided on the front display panel 100, the intermediate line extends in a complex shape along the shape of the front display panel 100 and the side display panel 200 due to the edge having the round shape. The area of the non-display area of the front display panel 100 and the side display panel 200 is required to be large for the intermediate line. Thus, the width of the bezel of the front display panel 100 and the side display panel 200 increases.

However, since the side display panel 200 directly receives the second signal from the driving chip 310, the intermediate line is not required and the area of the first and second non-display areas NDA1 and NDA2 is reduced.

FIG. 4 is an enlarged side view showing a driver circuit board and a portion of elements connected to the driver circuit board according to another exemplary embodiment of the present disclosure.

The driving chip 310 includes a plurality of third pins P3. The third pins P3 are disposed at the first side S1 of the driving chip 310 and adjacent to the first pins P1 in the first direction DR1. The third pins P3 are arranged in the first direction DR1 at regular intervals.

In the present exemplary embodiment, the driver circuit board 300 includes a plurality of third fan-out lines PL3.

One ends and the other ends of the third fan-out lines PL3 are electrically connected to the third pins P3 and the second conductive film FOG2, respectively. The one ends of the third fan-out lines PL3 are arranged in the first direction DR1 at regular intervals and the other ends of the third fan-out lines PL3 are arranged in the second direction DR2 at regular intervals.

The third fan-out lines PL3 extend in a fan-out structure. For example, the distance in the first direction DR1 between the one ends of the third fan-out lines PL3 is smaller than the distance in the second direction DR2 between the other ends of the third fan-out lines PL3.

In the present exemplary embodiment, the second signal includes a first sub-side signal and a second sub-side signal. The first and second sub-side signals are applied to areas of the side display panel 200, respectively.

The second pins P2 output the first sub-side signal. The second fan-out lines PL2 receive the first sub-side signal from the second pins P2 and apply the first sub-side signal to the second conductive film FOG2.

In addition, the third pins P3 output the second sub-side signal. The third fan-out lines PL3 receive the second sub-side signal from the third pins P3 and apply the second sub-side signal to the second conductive film FOG2.

Accordingly, the second conductive film FOG2 receives the first and second sub-side signals from the first pins P1 and the second pins P2, respectively, and applies the first and second sub-side signals to the side display panel.

As described above, the driving chip 310 applies the first and second sub-side signals through the second and third pins P2 and P3 as the second signal, and thus the number of the second pins P2 is reduced. As a result, the structure of the driving chip 310 is simplified and a degree of freedom of the design of the driving chip 310 is improved. For example, in the case where the number of the pixels (or a resolution) in the second direction DR2 of the side display panel 200 is great (or high), the degree of freedom of the design of the driving chip 310 is effectively improved.

Figure 5A:
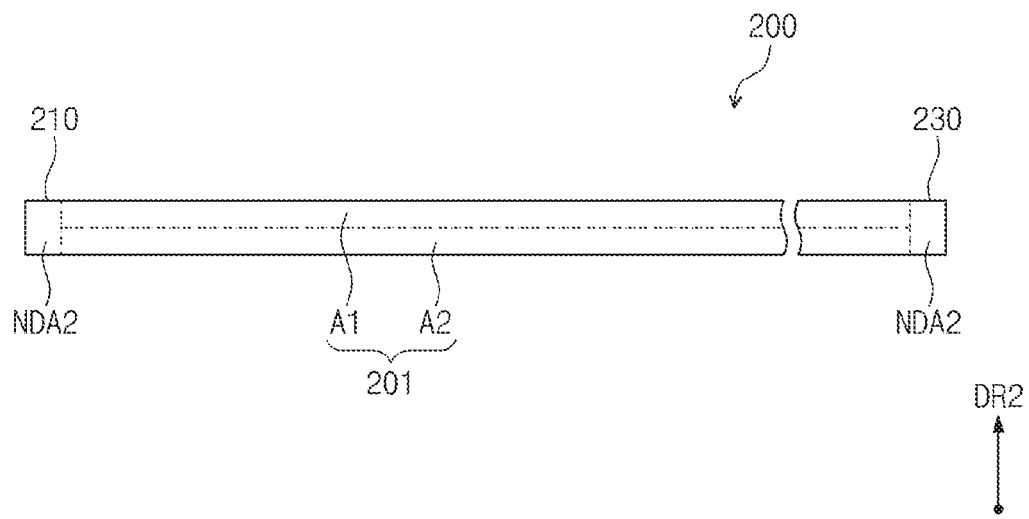
FIG. 5A is a plan view showing a side display panel that is stretched according to another exemplary embodiment of the present disclosure.
Figure 5B:
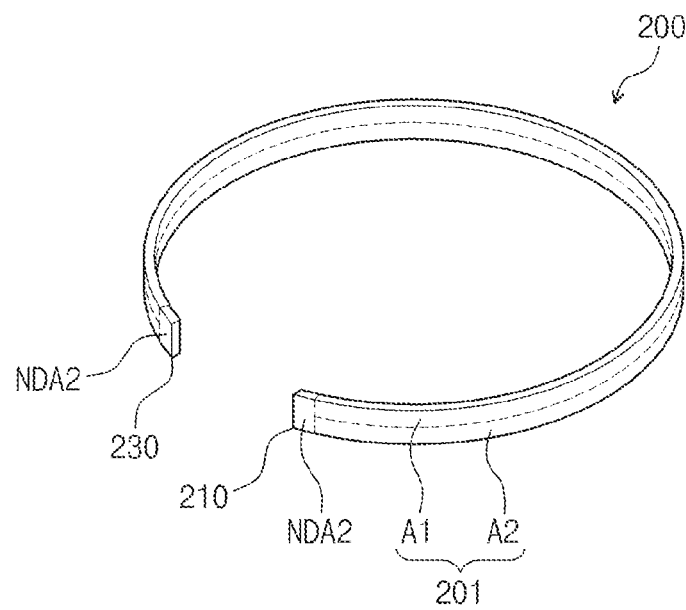
FIG. 5B is a perspective view showing the side display panel that is curved to be assembled shown in FIG. 5A.

FIG. 5A is a plan view showing a side display panel 200 that is stretched according to another exemplary embodiment of the present disclosure. FIG. 5B is a perspective view showing the side display panel 200 that is curved to be assembled shown in FIG. 5A. FIG. 5C is an enlarged plan view showing the side display panel 200 shown in FIG. 5B and a portion of a driver circuit board connected to the side display panel 200.

Referring to FIGS. 5A and 5B, the side display panel 200 includes a first area A1 and a second area A2. The first area A1 is defined adjacent to the second area A2 in the second direction DR2. For example, the first and second areas A1 and A2 are included in the side display surface 201, and thus the side display surface 201 is divided into two portions in the second direction DR2.

Referring to FIG. 5C, the display device 1000 further includes a third conductive film FOG3.

One end and the other end of the third conductive film FOG3 are respectively overlapped with the printed circuit board 350 and the side display panel 200 and respectively electrically connected to the printed circuit board 350 and the side display panel 200. In the present exemplary embodiment, the third conductive film FOG3 is disposed to correspond to the second area A2.

The third conductive film FOG3 includes a flexible printed circuit board and is electrically connected to the printed circuit board 350 and the side display panel 200 through an anisotropy conductive film (ACF) in a film-on-glass (FOG) manner.

The driving chip 310 includes a plurality of fourth pins P4. The fourth pins P4 are disposed at a third side S3 of the driving chip 310. The fourth pins P4 are arranged in the second direction DR2 at regular intervals.

The third side S3 is substantially parallel to the second direction DR2 and faces the third conductive film FOG3. In addition, the third side S3 is opposite to the second side S2 and disposed between the third conductive film FOG3 and the second side S2.

In the present exemplary embodiment, the driver circuit board 300 includes a plurality of fan-out lines PL4.

The fourth fan-out lines PL4 are interposed between the third conductive film FOG3 and the fourth pins P4, and one ends and the other ends of the fourth fan-out lines PL4 are electrically connected to the fourth pins P4 and the third conductive film FOG3, respectively. The fourth fan-out lines PL4 are arranged in the second direction DR2 at regular intervals.

The fourth fan-out lines PL4 extend in a fan-out structure. For example, the distance in the second direction DR2 between the one ends of the fourth fan-out lines PL4 is smaller than the distance in the second direction DR2 between the other ends of the fourth fan-out lines PL4.

In the present exemplary embodiment, the second signal includes a first sub-side signal and a second sub-side signal. The first and second sub-side signals are applied to the first and second areas A1 and A2, respectively.

The second pins P2 output the first sub-side signal. The second fan-out lines PL2 receive the first sub-side signal from the second pins P2 and apply the first sub-side signal to the second conductive film FOG2.

The fourth pins P4 output the second sub-side signal. The fourth fan-out lines PL4 receive the second sub-side signal from the fourth pins P4 and apply the second sub-side signal to the third conductive film FOG3.

In the present exemplary embodiment, the second conductive film FOG2 is disposed to correspond to the first area A1. The second conductive film FOG2 receives the first sub-side signal from the second fan-out lines PL2 and applies the first sub-side signal to the first area A1.

In addition, the third conductive film FOG3 is disposed to correspond to the second area A2. The third conductive film FOG3 receives the second sub-side signal from the fourth fan-out lines PL4 and applies the second sub-side signal to the second area A2.

Consequently, the first area A1 receives the first sub-side signal output from the second pins P2 through the second fan-out lines PL2 and the second conductive film FOG2. Accordingly, the side display panel 200 displays a portion of the side image through the first area A1.

Similarly, the second area A2 receives the second sub-side signal output from the fourth pins P4 through the fourth fan-out lines PL4 and the third conductive film FOG3. Therefore, the side display panel 200 displays a portion of the side image through the second area A2.

As described above, the driving chip 310 applies the first and second sub-side signals through the second and fourth pins P2 and P4 as the second signal, and thus the number of the second pins P2 is reduced. As a result, the structure of the driving chip 310 is simplified and a degree of freedom of design of the driving chip 310 is improved. For example, in the case where the number of the pixels (or a resolution) in the second direction DR2 of the side display panel 200 is great (or high), the degree of freedom of design of the driving chip 310 is effectively improved.

Figure 6A:
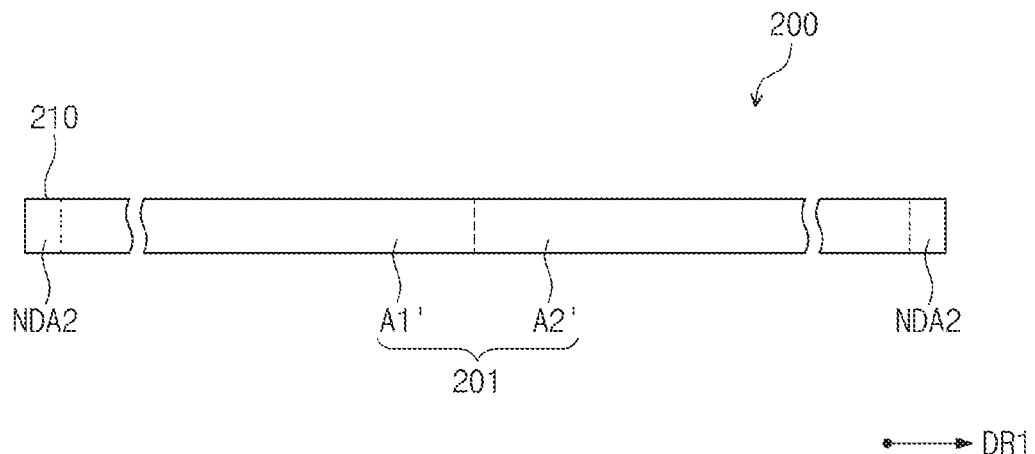
FIG. 6A is a plan view showing a side display panel that is stretched according to another exemplary embodiment of the present disclosure.
Figure 6B:
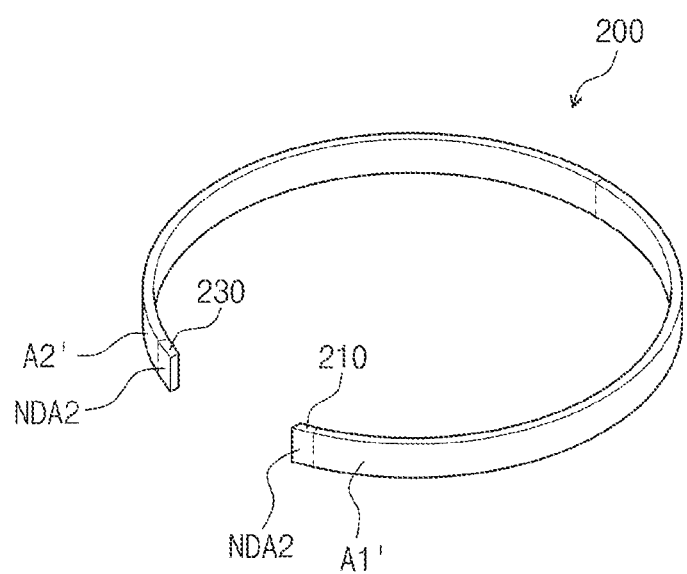
FIG. 6B is a perspective view showing the side display panel that is curved to be assembled shown in FIG. 6A.

FIG. 6A is a plan view showing a side display panel 200 that is stretched according to another exemplary embodiment of the present disclosure. FIG. 6B is a perspective view showing the side display panel 200 that is curved to be assembled shown in FIG. 6A. FIG. 6C is an enlarged plan view showing the side display panel 200 shown in FIG. 6B and a portion of a driver circuit board connected to the side display panel 200.

Referring to FIGS. 6A and 6B, the side display panel 200 includes a first area A1' and a second area A2'. The first area A1' is defined adjacent to the second area A2' in the first direction DR1. For example, the first and second areas A1' and A2' are included in the side display surface 201, and thus the side display surface 201 is divided into two portions in the first direction DR1.

In the present exemplary embodiment, the second signal includes a first sub-side signal and a second sub-side signal. The first and second sub-side signals are applied to the first and second areas A1' and A2', respectively.

Referring to FIG. 6C, the second pins P2 output the first sub-side signal. The second fan-out lines PL2 receive the first sub-side signal from the second pins P2 and apply the first sub-side signal to the second conductive film FOG2.

The fourth pins P4 output the second sub-side signal. The fourth fan-out lines PL4 receive the second sub-side signal from the fourth pins P4 and apply the second sub-side signal to the third conductive film FOG3.

In the present exemplary embodiment, the second conductive film FOG2 is disposed to correspond to the first area A1'. The second conductive film FOG2 receives the first sub-side signal from the second fan-out lines PL2 and applies the first sub-side signal to the first area A1'.

In addition, the third conductive film FOG3 is disposed to correspond to the second area A2'. The third conductive film FOG3 receives the second sub-side signal from the fourth fan-out lines PL4 and applies the second sub-side signal to the second area A2'.

Consequently, the first area A1' receives the first sub-side signal output from the second pins P2 through the second fan-out lines PL2 and the second conductive film FOG2. Accordingly, the side display panel 200 displays a portion of the side image through the first area A1'.

Similarly, the second area A2' receives the second sub-side signal output from the fourth pins P4 through the fourth fan-out lines PL4 and the third conductive film FOG3. Therefore, the side display panel 200 displays a portion of the side image through the second area A2'.

As described above, the driving chip 310 applies the first and second sub-side signals through the second and fourth pins P2 and P4 as the second signal, and thus the second signal can be prevented from being distorted. For example, since the side display panel 200 is divided into the first area A1 and the second area A2, a length in the first direction DR1 or the third direction DR3 of the gate lines provided in the first and second areas A1' and A2' is shortened. As a result, the signal can be prevented from being distorted due to the gate lines.

Although the inventive technology has been described, it is understood that the present invention should not be limited to these exemplary embodiments but various changes and modifications can be made by one ordinary skilled in the art within the spirit and scope of the present invention as hereinafter claimed.

What is claimed is:

1. A display device comprising:
   a front display panel configured to display a front image in a front direction and having a round edge when viewed from a front direction;
   a side display panel that is curved corresponding to the round edge of the front display panel when viewed from the front direction, configured to display a side image in a side direction different from the front direction, and separated from the front display panel; and
   a driver circuit board connected to the front and side display panels and configured to respectively apply first and second signals, corresponding to image data, to the front and side display panels, wherein the side display panel extends continuously around the round edge from one end of the driver circuit board to an opposite end of the driver circuit board.

2. The display device of claim 1, wherein the front display panel comprises a front display surface crossing the front direction, and wherein the side display panel comprises a side display surface crossing the side direction.

3. The display device of claim 2, wherein the side display surface is curved along the round edge.

4. The display device of claim 1, wherein the driver circuit board comprises a driving chip configured to generate the first and second signals.

5. A display device comprising:
a front display panel configured to display a front image in a front direction and having a round edge when viewed from a front direction;
a side display panel that is curved corresponding to the round edge of the front display panel when viewed from the front direction and configured to display a side image in a side direction different from the front direction;
a driver circuit board connected to the front and side display panels and configured to respectively apply first and second signals, corresponding to image data, to the front and side display panels, wherein the side display panel extends continuously around the round edge from one end of the driver circuit board to an opposite end of the driver circuit board, wherein the driver circuit board comprises a driving chip configured to generate the first and second signals,
a first conductive film configured to electrically connect the driving chip and the front display panel; and
a second conductive film configured to electrically connect the driving chip and a first end of the side display panel.

6. The display device of claim 5, wherein the driving chip comprises:
a plurality of first pins electrically connected to the first conductive film; and
a plurality of second pins electrically connected to the second conductive film.

7. The display device of claim 6, wherein the driving chip comprises a first side substantially parallel to a first direction and a second side substantially parallel to a second direction crossing the first direction, wherein the plurality of first pins are disposed on the first side, and wherein the plurality of second pins are disposed on the second side.

8. The display device of claim 7, wherein the driver circuit board comprises a plurality of first fan-out lines each having first and second ends opposing each other and a plurality of second fan-out lines each having first and second ends opposing each other, wherein the first ends of the plurality of first fan-out lines are respectively connected to the plurality of first pins, wherein the second ends of the plurality of first fan-out lines are connected to the first conductive film, wherein the first ends of the plurality of second fan-out lines are respectively connected to the plurality of second pins, and wherein the second ends of the plurality of second fan-out lines are connected to the second conductive film.

9. The display device of claim 8, wherein the driver circuit board comprises a plurality of third fan-out lines each having first and second ends opposing each other, wherein the driving chip comprises a plurality of third pins disposed on the first side, wherein the first ends of the plurality of third fan-out lines are respectively connected to the plurality of third pins, and wherein the second ends of the plurality of third fan-out lines are connected to the second conductive film.

10. The display device of claim 8, wherein the plurality of first fan-out lines are arranged in the first direction, and wherein the plurality of second fan-out lines are arranged in the second direction.

11. The display device of claim 7, wherein the side display panel surrounds the front display panel, wherein the first end of the side display panel is disposed adjacent to a first end of the driver circuit board in the first direction, and wherein a second end of the side display panel is disposed adjacent to a second end of the driver circuit board in a third direction opposite to the first direction.

12. The display device of claim 11, further comprising a third conductive film configured to connect the driving chip and the second end of the side display panel.

13. The display device of claim 12, wherein the driving chip comprises a plurality of fourth pins connected to the third conductive film.

14. The display device of claim 13, wherein the driving chip comprises a third side substantially parallel to the second direction and disposed adjacent to the second side in the third direction, and wherein the plurality of fourth pins are disposed on the third side.

15. The display device of claim 14, wherein the third conductive film is located farther from the front display panel than the second conductive film.

16. The display device of claim 14, wherein the second signal comprises a first side signal to be applied to a first area of the side display panel and a second side signal to be applied to a second area of the side display panel different from the first area, wherein the plurality of second pins are configured to output the first side signal, and wherein the plurality of fourth pins are configured to output the second side signal.

17. The display device of claim 16, wherein the first area is located adjacent to the second area in the second direction.

18. The display device of claim 16, wherein the second area is located adjacent to the first area in the third direction.

19. The display device of claim 1, wherein the first signal comprises a first data voltage, and wherein the second signal comprises a second data voltage.

20. The display device of claim 19, wherein the front display panel includes a plurality of front pixel circuits including a plurality of transistors, wherein the side display panel includes a plurality of side pixel circuits including a plurality of transistors, wherein the plurality of transistors of the plurality of front pixel circuits are configured to be turned on based on the first signal, and wherein the plurality of transistors of the plurality of side pixel circuits are configured to be turned on based on the second signal.

21. The display device of claim 1, further comprising a body portion comprising an upper surface crossing the front direction and a side surface crossing the side direction, wherein the front display panel is coupled to the upper surface of the body portion, and wherein the side display panel is coupled to the side surface of the body portion.

22. The display device of claim 1, wherein the front display panel has substantially a circular plate shape, and wherein the side display panel is curved and surrounds a circumference of the front display panel.

23. The display device of claim 1, wherein the front direction crosses the side direction.

24. A smart watch comprising:
a body portion having an upper surface having a circular plate shape and a side surface adjacent to the upper surface;
a front display panel disposed over the upper surface of the body portion and comprising a round edge when viewed from a front direction;
a side display panel disposed over the side surface of the body portion and curved to surround the round edge when viewed from the front direction;
a driver circuit board disposed over the side surface of the body portion, wherein the driver circuit board comprises a first pad area adjacent to the front display panel and a second pad area facing an end of the side display panel, wherein the side display panel extends continuously around the round edge from one end of the driver circuit board to an opposite end of the driver circuit board;
a first conductive film configured to connect the first pad area and the front display panel; and
a second conductive film configured to connect the second pad area and an end of the side display panel.

25. The smart watch of claim 24, wherein the body portion includes a slanted surface connecting the front and side display panels.

* * * * *